United States Patent
Ryu

(10) Patent No.: US 7,819,975 B2
(45) Date of Patent: Oct. 26, 2010

(54) DEPOSITION METHOD AND APPARATUS

(75) Inventor: Seoung-Yoon Ryu, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1375 days.

(21) Appl. No.: 11/266,398

(22) Filed: Nov. 4, 2005

(65) Prior Publication Data
US 2006/0099820 A1    May 11, 2006

(30) Foreign Application Priority Data
Nov. 5, 2004    (KR) .................. 10-2004-0089649

(51) Int. Cl.
C23C 16/00    (2006.01)
H01L 21/31    (2006.01)
H01L 21/469    (2006.01)

(52) U.S. Cl. ...................... 118/727; 118/726
(58) Field of Classification Search .............. 118/727
See application file for complete search history.

(56) References Cited

U.S. PATENT DOCUMENTS 4,632,059 A * 12/1986 Flatscher et al. ............ 118/727
6,509,061 B1   1/2003 Ida et al.
6,830,626 B1 * 12/2004 Smith .......................... 118/726
2003/0168013 A1 *  9/2003 Freeman et al. ............. 118/726
2004/0123804 A1 *  7/2004 Yamazaki et al. ...... 118/723 VE

FOREIGN PATENT DOCUMENTS

| CN | 1444423 | 9/2003 |
|---|---|---|
| JP | 11504077 | 4/1999 |
| JP | 11200017 | 7/1999 |
| JP | 2003-86374 | 3/2003 |
| JP | 2003297570 | 10/2003 |

OTHER PUBLICATIONS

Chinese Office Action dated Feb. 6, 2009.
Chinese Certificate of Patent for Invention, Certificate No. 642366, date Jun. 16, 2010.

* cited by examiner

*Primary Examiner*—Michael Cleveland
*Assistant Examiner*—Nathan K Ford
(74) *Attorney, Agent, or Firm*—H.C. Park & Associates, PLC

(57) ABSTRACT

A deposition method and apparatus provide a uniform deposition rate and good reproducibility in a process used to deposit a material onto a substrate. The deposition method includes preparing a substrate on which a thin film is deposited, preparing a line source that includes a plurality of heating crucibles are disposed in line, and rotating the line source while depositing the deposition material on the substrate.

11 Claims, 3 Drawing Sheets

DEPOSITION METHOD AND APPARATUS

CROSS REFERENCE TO RELATED APPLICATION

This application claims priority to and the benefit of Korean Patent Application No. 10-2004-0089649, filed on Nov. 5, 2004, which is hereby incorporated by reference for all purposes as if fully set forth herein.

BACKGROUND OF THE INVENTION

1. Field of the Invention

The present invention relates to a deposition method and apparatus having a uniform deposition rate and good reproducibility.

2. Discussion of the Background

Electroluminescence display devices are expected to be the next generation of emissive display devices due to their wide viewing angles, high contrast, and high response speed.

Electroluminescence display devices may be classified as either organic light emitting display devices or inorganic light emitting display devices according to the material used to form an emission layer (EML) included therein. Organic light emitting display devices are brighter and have higher driving voltages and higher response speeds than inorganic light emitting display devices. Organic light emitting display devices can also display color images.

An organic light emitting diode (OLED) includes an inner layer located between two electrodes. The inner layer may include a variety of layers including a Hole Injection Layer (HIL), a Hole Transport Layer (HTL), an EML, an Electron Transport Layer (ETL), an Electron Injection Layer (EIL), or the like. These layers are known as organic thin films.

Organic thin films such as the HIL, HTL, EML, ETL, EIL or the like can be formed on a substrate using a deposition method in a deposition apparatus.

During a deposition method, a thin film is fabricated on a substrate in a vacuum chamber by heating a heating crucible to evaporate or sublimate an organic material to be deposited.

The organic material forming the thin film of the OLED is evaporated or sublimated at a temperature range of 250° C. to 450° C. and at a degree of vacuum of $10^{-6}$ to $10^{-7}$ torr. The material used to form the electrodes usually evaporates at a higher temperature than the temperature at which the organic material evaporates, but the evaporation temperature of the electrodes varies according to the type of electrode material used. Electrode materials, such as magnesium (Mg), silver (Ag), aluminum (Al), and lithium (Li) evaporate at temperatures of about 500° C. to 600° C., 1000° C., 1000° C., and 300° C., respectively.

It is vital that the film deposited on the substrate has a uniform thickness. A variety of methods can be found in the prior art that attempt to optimize the uniform thickness of the film deposited on the substrate. In one conventional method, the substrate may be rotated and the distance between a single deposition source and the substrate may be maximized to optimize the uniform thickness of the film. But it is impossible to increase the distance between the single deposition source and the substrate to the distance needed to deposit a film of uniform thickness due to equipment constraints. Therefore, a single deposition source cannot produce a film of uniform thickness on a substrate due to the incidence angle of the deposition material when the substrate is rotated.

A symmetrical multi-deposition source has been used in the prior art to minimize the distance between the deposition source and the substrate in an attempt to optimize the uniform thickness of the film. But the thin film deposited on the substrate did not have a uniform thickness due to the positions of the deposition sources. Many deposition sources are required to solve this problem, which becomes prohibitively expensive.

It is more difficult to achieve a uniform thickness of the thin film when the symmetrical multi-deposition source uses a mask to deposit the thin film on the substrate because a shadow effect is produced between the mask slits and the substrate. The distance between the substrate and the deposition source must be maximized to overcome the shadow effect.

The distance between the substrate and the deposition source is a vital factor in maintaining the uniform thickness of the film. The film thickness will be more uniform if the distance between the substrate and the deposition source is increased. But a larger distance between the substrate and the deposition source reduces the deposition rate, changes the characteristics of the material to be deposited, and requires more equipment.

SUMMARY OF THE INVENTION

The present invention provides a deposition method and apparatus that provide a uniform deposition rate and good reproducibility in a process used to deposit a material onto a substrate. The deposition method includes preparing a substrate on which a thin film is deposited, preparing a line source that includes a plurality of heating crucibles disposed in line, and rotating the line source while depositing the deposition material on the substrate. The heating crucibles closer to the ends of the line source may have a progressively higher deposition rate to increase the amount of the material deposited near the edge of the substrate. Or the distances between adjacent heating crucibles closer to the end of the line source may be progressively reduced to increase the amount of the material deposited near the edge of the substrate.

Additional features of the invention will be set forth in the description which follows, and in part will be apparent from the description, or may be learned by practice of the invention.

The present invention discloses a deposition method including the steps of preparing a substrate on which a thin film is deposited, preparing a line source that includes a plurality of heating crucibles disposed in line for heating a deposition material and depositing the deposition material on the substrate, and rotating the line source and depositing the deposition material on the substrate.

The present invention also discloses a deposition apparatus including a supporting member supporting a substrate on which a deposition film is formed, a line source that includes a plurality of heating crucibles disposed in line for emitting a material to be deposited on the substrate, and an actuator for rotating the line source.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
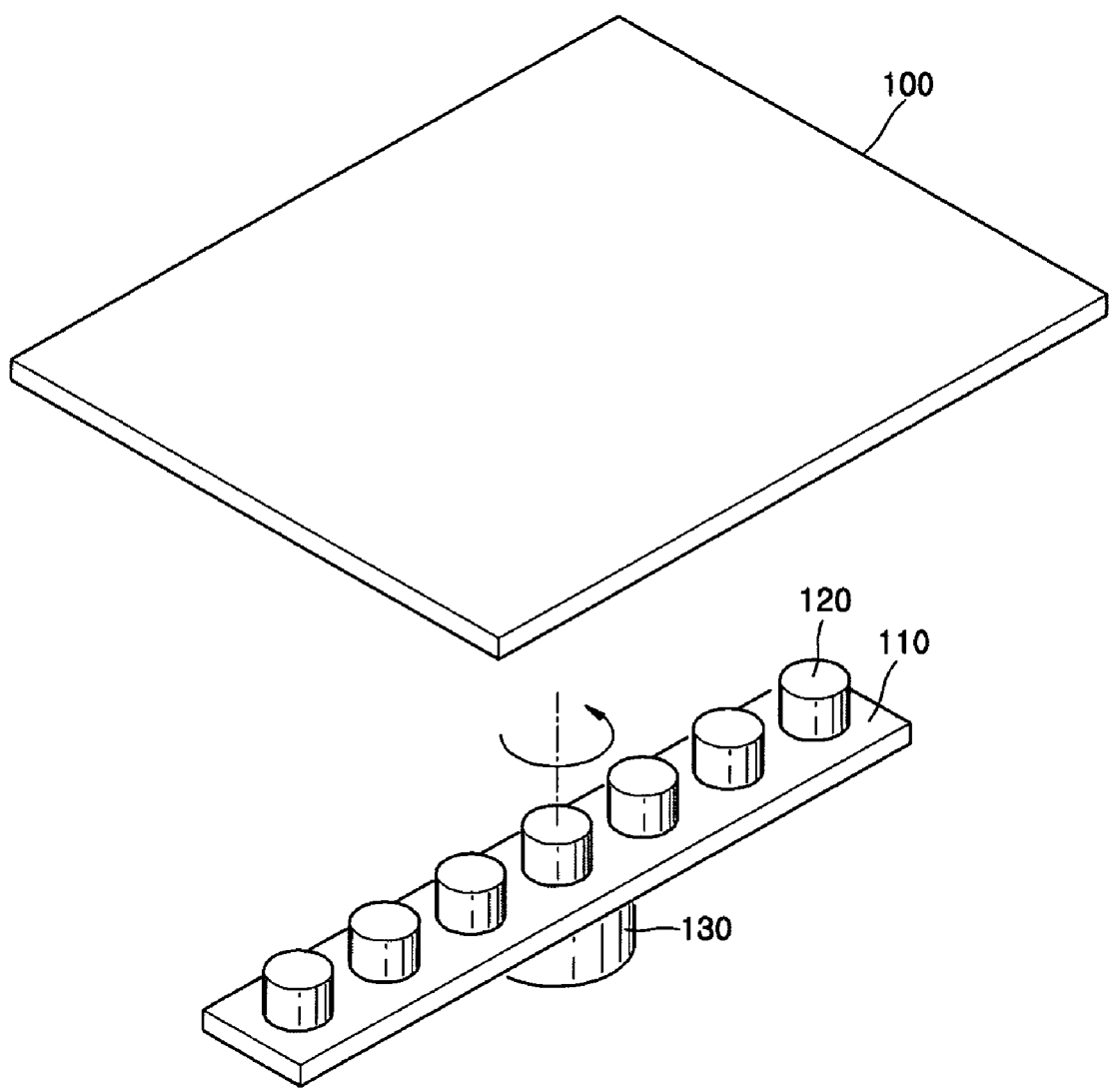
FIG. 1 shows a perspective view of part of a deposition apparatus according to an exemplary embodiment of the present invention.

An exemplary embodiment of the invention discloses a method and apparatus for forming a film on a small substrate with a uniform thickness and density by rotating and depositing material from a line source including a plurality of heating crucibles.

Another exemplary embodiment of the invention discloses a method and apparatus for forming a film on a substrate with a uniform thickness and density by rotating and depositing material from a line source including a plurality of heating crucibles where the heating crucibles closer to the end of the line source have a progressively higher deposition rate to increase the amount of the material deposited closer to the edge of the substrate.

Another exemplary embodiment of the invention discloses a method and apparatus for forming a film on a substrate with a uniform thickness and density by rotating and depositing material from a line source including a plurality of heating crucibles where the distances between adjacent heating crucibles closer to the end of the line source are progressively reduced to increase the amount of the material deposited closer to the edge of the substrate.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a perspective view schematically illustrating a part of a deposition apparatus according to an embodiment of the present invention.

Referring to FIG. 1, the deposition apparatus includes a supporting member (not shown) for supporting a substrate 100 on which a deposition film is formed, a line source 110 that includes a plurality of heating crucibles 120 disposed in line for emitting a material to be deposited on the substrate 100, and an actuator 130 for rotating the line source 110.

The actuator 130 is positioned under the line source 110 and rotates the line source 110 including the heating crucibles 120. This rotation allows the deposition film to be formed on the substrate 110 using fewer heating crucibles and reduces the cost of making the deposition apparatus.

The line source 110 including the heating crucibles 120 rotates during the deposition process to deposit a film on the surface of the substrate 100 facing the line source 110.

Figure 2:
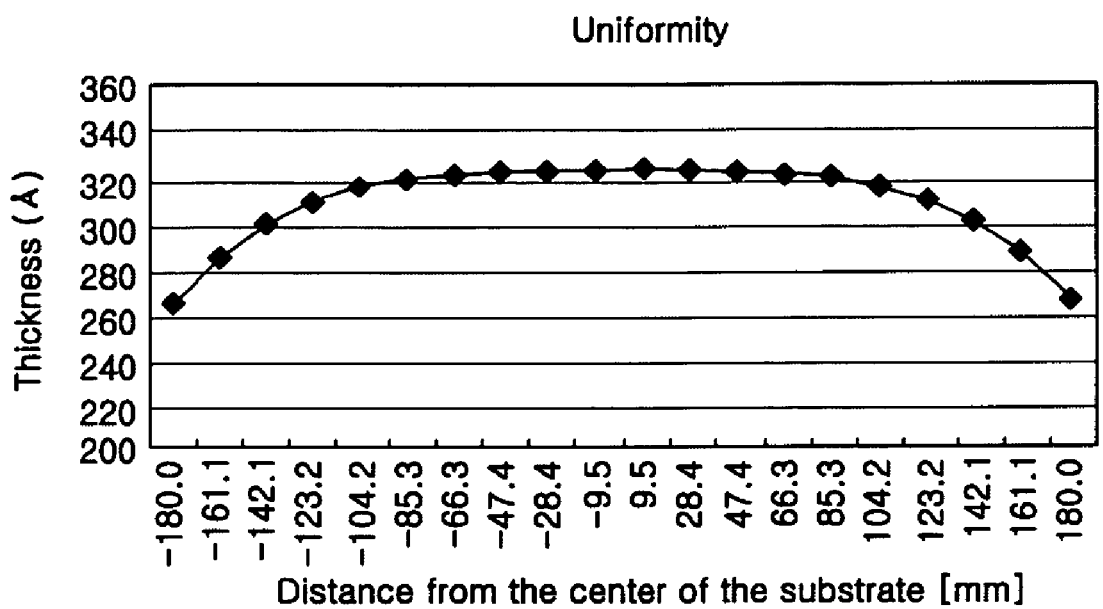
FIG. 2 shows a graph of the thickness of thin films deposited on a substrate versus the distance from the center of the substrate.

FIG. 2 is a graph illustrating the thickness of thin films deposited on the substrate 100 by the deposition apparatus shown in FIG. 1 versus the distance from the center of the substrate 100. The horizontal axis indicates that distance in mm from the center of the substrate 100, and the vertical axis indicates the thickness in angstroms (Å) of the thin film deposited.

The graph of FIG. 2 shows that the deposition apparatus shown in FIG. 1 can deposit a thin film with a uniform thickness and density on a small substrate. In this example, the thin film has a uniform thickness of about 320 Å to a distance of 120 mm from the center of the substrate 100. But when the deposition apparatus deposits a thin film on a large substrate, the large substrate will not have uniform thickness and density at its edges.

Figure 3:
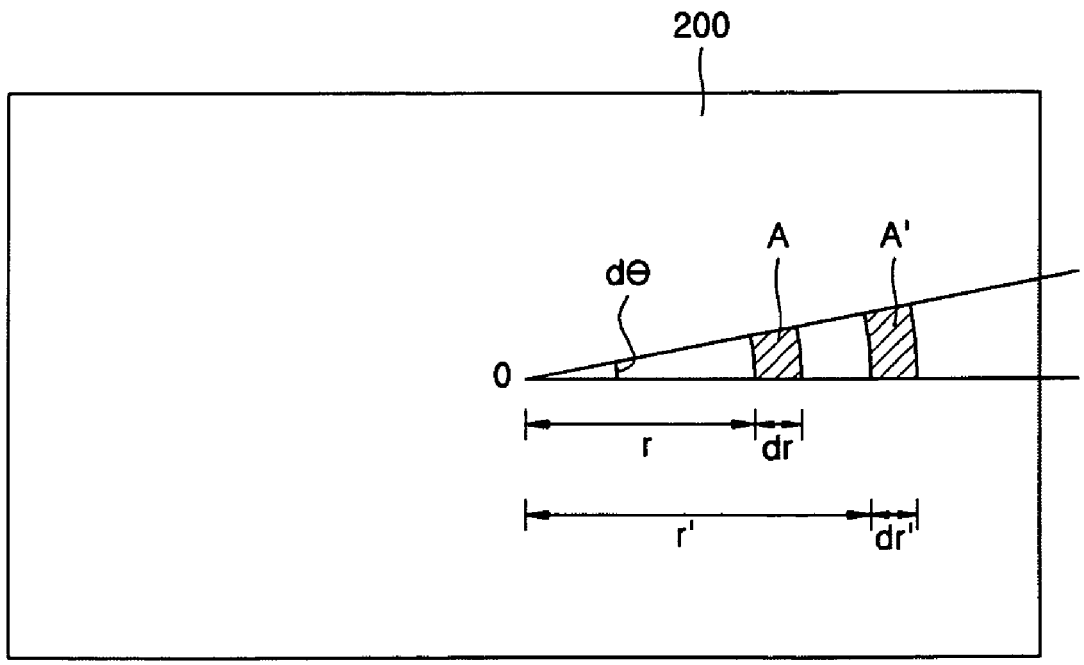
FIG. 3 shows a conceptual view of the operation principle of a deposition apparatus according to an exemplary embodiment of the present invention.
Figure 4:
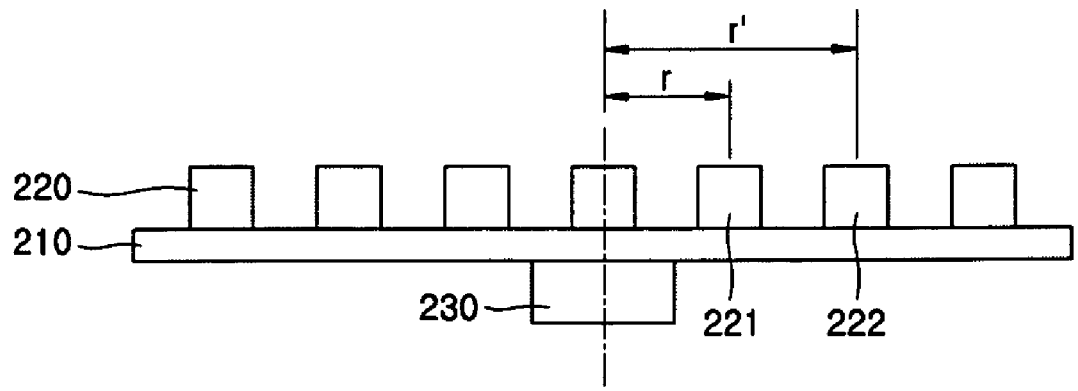
FIG. 4 shows a cross-sectional view of part of the deposition apparatus according to an exemplary embodiment of the present invention.

FIG. 3 is a conceptual view of the operation principles of a deposition apparatus according to an exemplary embodiment of the present invention. FIG. 4 is a cross-sectional view of part of the deposition apparatus according to an exemplary embodiment of the present invention.

The deposition apparatus illustrated in FIG. 3 and FIG. 4 includes a supporting member (not shown) for supporting a substrate 200 on which a deposition film is formed, a line source 210 that includes a plurality of heating crucibles 220 disposed in line for emitting a material to be deposited on the substrate 200, and an actuator 230 for rotating the line source 210.

Heating crucibles 220 located closer to the ends of the line source 210 have a higher deposition rate than heating crucibles 220 located closer to the center. This causes the thickness of the thin film to be uniform at the edges of a large substrate. Each of the heating crucibles 220 has a different deposition rate according to its position. It is important to exactly determine the deposition rate of each of the heating crucibles 220.

The deposition rate of each of the plurality of heating crucibles 220 will now be described with reference to FIG. 3.

0 denotes the center of the substrate 200, and A denotes the area of a material deposited by a heating crucible 221 at a distance r from the center 0 of the substrate 200 during a time dt. As an example, suppose that the material is deposited in a region dr by the heating crucible 221. When the line source 210 rotates by an angle dθ during the time dt, the area A of the material deposited by the heating crucible 221 during the time dt is as follows:

$$A = r \cdot dr \cdot d\theta \quad (1)$$

A' denotes the area of a material deposited by a heating crucible 222 at a distance r' from the center 0 of the substrate 200 during the time dt. As an example, suppose that the material is deposited in a region dr' by the heating crucible 222. When the line source 210 rotates by an angle dθ during the time dt, the area A' of the material deposited by the heating crucible 222 during the time dt is as follows:

$$A' = r' \cdot dr' \cdot d\theta \quad (2)$$

m is the amount of the material deposited on the substrate 200 per unit of area. M and M' are the total amount of the material deposited on A and A', respectively. M and M' are calculated as follows:

$$M = m \cdot A = m \cdot r \cdot dr \cdot d\theta \quad (3)$$

$$M' = m \cdot A' = m \cdot r' \cdot dr' \cdot d\theta \quad (4)$$

The deposition rate R of the heating crucible 221 at the distance r from the center of the line source 210 and the deposition rate R' of the heating crucible 222 at the distance r' from the center of the line source 210 are calculated as follows:

$$R = M/dt = m \cdot r \cdot dr \cdot d\theta/dt \quad (5)$$

$$R' = M'/dt = m \cdot r' \cdot dr' \cdot d\theta/dt \quad (6)$$

The following equation is obtained from equations 5 and 6:

$$m \cdot d\theta/dt = R/(r \cdot dr) = R'/(r' \cdot dr') \quad (7)$$

The area deposited by the heating crucible 221 at the distance r from the center 0 of the line source 210 and the area deposited by the heating crucible 222 at the distance r' from the center 0 of the line source 210 are proportional to distances dr and dr' from the center 0 of the substrate 200 to the end of the substrate 200, respectively. The following equation indicates the relationship between the deposition rates R and R' and is obtained from equation 7:

$$R' = (r'/r) \cdot R \quad (8)$$

Equation 8 indicates that the deposition rate of a heating crucible 220 must be proportional to the distance between the center of the line source 210 and the position of that heating crucible 220. Using this method, a material deposited on a large substrate may have a thin film with a uniform thickness and density.

Figure 5:
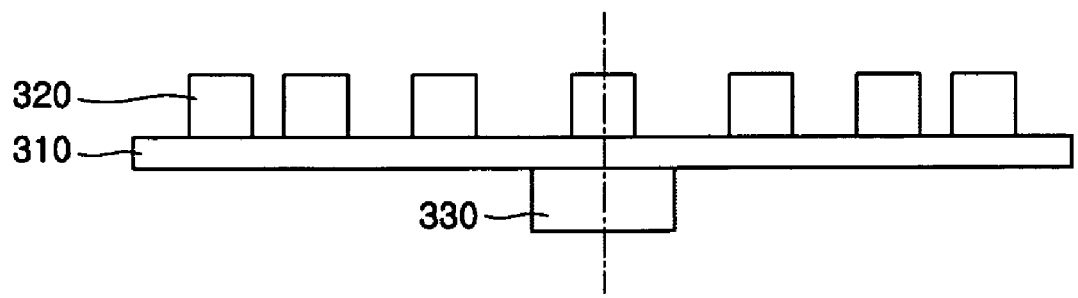
FIG. 5 shows a cross-sectional view of part of a deposition apparatus according to an exemplary embodiment of the present invention.

FIG. 5 is a cross-sectional view schematically illustrating part of a deposition apparatus according to an exemplary embodiment of the present invention.

The deposition apparatus shown in FIG. 5 includes a supporting member (not shown) for supporting a substrate on which a deposition film is formed, a line source 310 including a plurality of heating crucibles 320 disposed in line for emitting a material to be deposited on the substrate, and an actuator 330 for rotating the line source 310.

The distances between adjacent heating crucibles 320 that are closer to the end of the line source 310 are smaller than the distances between adjacent heating crucibles 320 that are closer to the center of the line source 310. The heating crucibles 320 in a first direction of the line source 310 may be placed so as to be symmetrical with the heating crucibles 320 in the second direction of the line source 310. This increases the amount of the material deposited at the edges of the substrate 310 and maintains the thickness of the thin film at the edges of the large substrate.

Figure 6:
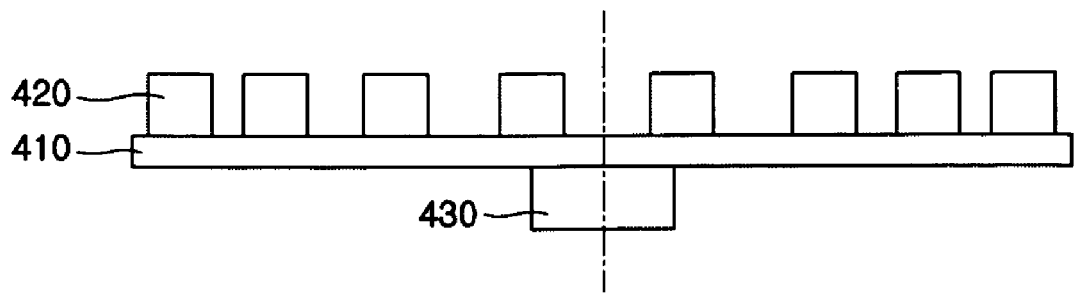
FIG. 6 shows a cross-sectional view of part of a deposition apparatus according to an exemplary embodiment of the present invention.

FIG. 6 is a cross-sectional view schematically illustrating a part of a deposition apparatus according to an exemplary embodiment of the present invention.

The deposition apparatus illustrated in FIG. 6 includes a supporting member (not shown) for supporting a substrate on which a deposition film is formed, a line source 410 that includes a plurality of heating crucibles 420 disposed in line for emitting a material to be deposited on the substrate, and an actuator 430 for rotating the line source 410.

The distances between adjacent heating crucibles 420 that are closer to the end of the line source 410 are smaller than the distances between adjacent heating crucibles 420 that are closer to the center of the line source 410. Unlike the deposition apparatus illustrated in FIG. 5, the heating crucibles 420 in a first direction of the line source 410 may be placed so as to be asymmetrical with the heating crucibles 420 in the second direction of the line source 410. This enables the thin film deposited by the deposition apparatus to have a uniform thickness and density.

It is further possible to combine the described exemplary embodiments to produce a deposition method and apparatus that includes heating crucibles with progressively decreasing distances between adjacent heating crucibles located further away from the center of the line source, placed either symmetrically or asymmetrically around the center of the line source, with deposition rates that are progressively increased in the heating crucibles located farther away from the center of the line source.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A deposition apparatus, comprising:
   a supporting member to support a substrate, the substrate having a deposition surface and a central axis,
   a line source having a central axis and comprising at least three heating crucibles disposed in line, wherein the heating crucibles are exposed to the deposition surface and emit a material to be deposited on the deposition surface, and
   an actuator to turn the line source about its central axis, wherein the central axis of the substrate and the central axis of the line source are coaxial,
   wherein at least one heating crucible is disposed on the central axis of the line source.

2. The deposition apparatus of claim 1,
   wherein at least one heating crucible has a deposition rate that is different from at least one other heating crucible.

3. The deposition apparatus of claim 2,
   wherein each heating crucible has a higher deposition rate than every heating crucible that is closer to the center of the line source.

4. The deposition apparatus of claim 3,
   wherein the distances between adjacent heating crucibles are identical to each other.

5. The deposition apparatus of claim 3,
   wherein the deposition rate of each heating crucible is proportional to the distance of the heating crucible from the center of the line source.

6. The deposition apparatus of claim 1,
   wherein at least one distance between adjacent heating crucibles is different from at least one other distance between adjacent heating crucibles.

7. The deposition apparatus of claim 6,
   wherein the distance between adjacent heating crucibles that are farther from the center of the line source is smaller than the distance between adjacent heating crucibles that are closer to the center of the line source.

8. The deposition apparatus of claim 7,
   wherein the distances between adjacent heating crucibles in a first direction from the center of the line source are symmetrical to the distances between adjacent heating crucibles in a second direction from the center of the line source.

9. The deposition apparatus of claim 7,
   wherein the distances between adjacent heating crucibles in a first direction from the center of the line source are asymmetrical to the distances between adjacent heating crucibles in a second direction from the center of the line source.

10. The deposition apparatus of claim 7,
    wherein at least two heating crucibles have the same deposition rate.

11. The deposition apparatus of claim 1, wherein the actuator turns the line source on the axis while the heating crucibles emit the material to be deposited on the substrate.

\* \* \* \* \*